US008751176B2

(12) United States Patent
Wang

(10) Patent No.: US 8,751,176 B2
(45) Date of Patent: Jun. 10, 2014

(54) APPARATUS FOR MONITORING BATTERY VOLTAGE AND TEMPERATURE

(75) Inventor: Yue Wang, Anhui (CN)

(73) Assignee: Chery Automobile Co., Ltd., Anhui (CN)

( * ) Notice: Subject to any disclaimer, the term of this patent is extended or adjusted under 35 U.S.C. 154(b) by 143 days.

(21) Appl. No.: 13/128,070

(22) PCT Filed: Nov. 18, 2009

(86) PCT No.: PCT/CN2009/075013
§ 371 (c)(1),
(2), (4) Date: May 6, 2011

(87) PCT Pub. No.: WO2010/057429
PCT Pub. Date: May 27, 2010

(65) Prior Publication Data
US 2011/0218748 A1    Sep. 8, 2011

(30) Foreign Application Priority Data
Nov. 20, 2008  (CN) .......................... 2008 1 0180961

(51) Int. Cl.
*G01R 31/36*    (2006.01)
*B60L 11/18*    (2006.01)
*G01K 13/10*    (2006.01)

(52) U.S. Cl.
CPC ........... *G01R 31/3658* (2013.01); *Y02T 10/705* (2013.01); *G01R 31/362* (2013.01); *Y02T 10/7005* (2013.01); *Y02T 10/7044* (2013.01); *Y02T 90/16* (2013.01); *B60L 11/1861* (2013.01); *G01K 13/10* (2013.01)
USPC ............... 702/63; 702/188; 429/61; 324/434; 324/426; 324/432; 324/433; 340/636.1; 375/219; 320/107; 320/116; 320/118; 320/132; 320/104

(58) Field of Classification Search
USPC ......................................................... 702/63
See application file for complete search history.

(56) References Cited

U.S. PATENT DOCUMENTS 5,712,568 A    1/1998 Flohr et al.
5,808,469 A    9/1998 Kopera
(Continued)

FOREIGN PATENT DOCUMENTS

CN    1746695    3/2006
CN    2890947    4/2007
(Continued)

OTHER PUBLICATIONS

International Search Report, PCT/CN2009/075013, 6 pages, date of mailing Feb. 11, 2010.
(Continued)

*Primary Examiner* — Tung S Lau
*Assistant Examiner* — Stephanie Chang

(57) ABSTRACT

An apparatus for monitoring battery voltage and temperature includes a host controller and acquisition boards, and every acquisition board for the battery includes a voltage acquisition module, a temperature acquisition module, a host control chip MCU, A/D convertor module, an opto-isolator module, a CAN bus communication module and two external connection ports CN1, CN2. The input end of the AD transformation module is connected with the output end of the voltage acquisition module and the temperature acquisition module, and the output end of the A/D convertor module is connected with the opto-isolator module via a SPI bus, and the I/O port of the SPI bus module in the main control chip MCU is connected with the opto-couple isolation module, and the host control chip MCU is connected with the CAN bus communication module of the host controller via the CAN bus communication module, and the acquisition boards are connected via a socket piece in turn.

9 Claims, 2 Drawing Sheets

(56) References Cited

U.S. PATENT DOCUMENTS

| | | | |
|---|---|---|---|
| 8,203,345 B2* | 6/2012 | Bertness | 324/426 |
| 8,258,793 B2* | 9/2012 | Frisch et al. | 324/433 |
| 8,513,949 B2* | 8/2013 | Bertness | 324/426 |
| 2002/0162014 A1* | 10/2002 | Przydatek et al. | 713/200 |
| 2003/0048106 A1* | 3/2003 | Bertness et al. | 324/426 |
| 2004/0095249 A1* | 5/2004 | Zaccaria | 340/636.1 |
| 2006/0259280 A1* | 11/2006 | Zaccaria | 702/188 |
| 2007/0046261 A1* | 3/2007 | Porebski | 320/132 |
| 2007/0296202 A1* | 12/2007 | Zwahlen | 283/58 |
| 2010/0314950 A1* | 12/2010 | Rutkowski et al. | 307/125 |
| 2011/0049977 A1* | 3/2011 | Onnerud et al. | 307/9.1 |
| 2011/0112781 A1* | 5/2011 | Anderson et al. | 702/63 |
| 2011/0148363 A1* | 6/2011 | Frisch et al. | 320/162 |
| 2011/0166689 A1* | 7/2011 | Alden et al. | 700/108 |
| 2011/0218748 A1* | 9/2011 | Wang | 702/63 |
| 2011/0254502 A1* | 10/2011 | Yount et al. | 320/107 |
| 2012/0074904 A1* | 3/2012 | Rutkowski et al. | 320/112 |
| 2012/0098543 A1* | 4/2012 | Rutkowski et al. | 324/435 |
| 2012/0105001 A1* | 5/2012 | Gallegos et al. | 320/109 |
| 2012/0200257 A1* | 8/2012 | Schwarz et al. | 320/109 |
| 2012/0249334 A1* | 10/2012 | Dao et al. | 340/636.1 |
| 2012/0257655 A1* | 10/2012 | Muth | 375/219 |
| 2012/0282500 A1* | 11/2012 | Tzivanopoulos et al. | 429/61 |

FOREIGN PATENT DOCUMENTS

| | | |
|---|---|---|
| CN | 200996990 | 12/2007 |
| CN | 101509960 | 8/2009 |
| JP | 2007-42501 | 2/2007 |

OTHER PUBLICATIONS

Written Opinion, PCT/CN2009/075013, 6 pages, date of mailing Feb. 11, 2010.

* cited by examiner

APPARATUS FOR MONITORING BATTERY VOLTAGE AND TEMPERATURE

FIELD OF THE INVENTION

The present invention relates to the technical field of battery status monitoring, in particular to an apparatus for monitoring battery voltage and temperature.

DESCRIPTION OF THE PRIOR ART

As energy storage devices of modern vehicles, batteries are critical in ensuring the normal operation of vehicles. For hybrid electric vehicles and electric vehicles, large capacity battery packs have become pivotal means for the entire vehicle power system. After repeated charging-discharging cycles, unbalance tends to occur among battery packs, leading to capacity differences among batteries. This will cause strong impact on the storage capacity of battery packs and in turn affect the power supply for the vehicles. Even worse, when the capacity unbalance reaches certain extent, some batteries can be damaged, and thus service life of battery packs will be shorten. Therefore, it is necessary to monitor the operation states of battery packs in real time including detecting such parameters as the voltage of each set of batteries, the total voltage of battery packs, the temperature of batteries and the charging/discharging current of batteries, sending the detection results to the host controller and receiving instruction from the host controller, etc. All these monitoring operations require that the data acquisition circuit of the battery packs have very high precision and reliability. Currently, the data acquisition circuits for battery packs are mainly divided into centralized type and distributed type. The centralized data acquisition circuit is based on one single data acquisition circuit board and uses multi-way switch to switch to each battery pack for data acquisition in turns. The major advantage of centralized data acquisition circuit is the reduced cost. However, since all the battery packs share one single data acquisition circuit board, it is impossible to accurately measure the datum of all the battery packs once malfunction occurs to the data acquisition circuit board. In addition, due to high degree of centralization, it is difficult to expand this collection circuit board and it cannot be configured flexibly with quantity of battery packs. With distributed acquisition circuits, one acquisition circuit board is configured for each battery pack, and operation status data of all the battery pack are acquired concurrently, which means higher data acquisition speed and more convenience for configurative expansion and maintenance. However, since multiple acquisition circuit boards are used in such distributed data acquisition circuit, cost is accordingly high.

SUMMARY OF THE INVENTION

With the view of the defects of the prior art that the centralized acquisition circuit has difficult for expansion and fails to flexibly match the quantity of battery packs and that the traditional distributed acquisition circuits are higher cost and low precision, the object of this invention is to provide an apparatus for monitoring battery voltage and temperature. The voltage data acquisition precision of battery packs and the counter-interference capability of the voltage acquisition circuit are not only improved, the manufacture cost of the distributed acquisition board is also reduced and its maintenance becomes easier.

The technical object of the present invention is realized by employing the following technical solution:

An apparatus for monitoring battery voltage and temperature comprising a host controller and acquisition boards, wherein, the quantity of the acquisition boards equals to the quantity of battery packs to be monitored, and each acquisition board only collects the voltage and temperature of one single battery pack. The acquisition board for each battery pack comprises a voltage acquisition module, a temperature acquisition module, a host control chip MCU, an A/D convertor module, an opto-isolator module or a coil isolator module, a CAN bus communication module and two external connection ports CN1, CN2. The input end of the A/D convertor module is connected with the output ends of the voltage acquisition module and the temperature acquisition module, the output end of the A/D convertor module is connected with the opto-isolator module, the I/O port of the SPI bus module on the host control chip MCU is connected with the opto-isolator module, and the host control chip MCU is connected with the A/D convertor module via a SPI bus communication, so that the opto-isolator module isolates the voltage acquisition module and the temperature acquisition module from the host control chip MCU, and thus the problem of common mode between the high-voltage battery and low-voltage control circuit is solved. The host control chip MCU is connected with the CAN bus communication module on the host controller via the CAN bus communication module; the acquisition boards are connected with one another in turn with connection port CN1 of one acquisition board being connected with connection port CN2 of the next acquisition board via a socket piece. Both connection port CN1 and connection port CN2 are 6-pin ports, one pin as power supply line, two pins as grounding line, two pins as CAN bus and one pin as I/O port of the host control chip MCU on the acquisition board. After being stabilized by a voltage stabilizing circuit, the power supply of the host controller powers the host control chip MCU, the opto-isolator module and CAN driver module of each acquisition board via the connection ports of the acquisition board.

The power supply for the voltage acquisition module, the temperature acquisition module, the A/D convertor module and the opto-isolator module can be provided by one single battery pack after its voltage being filtered and stabilized.

The control signal issued by the host control chip MCU on the acquisition board through its SPI bus passes through the opto-isolator module and instructs the voltage acquisition module, the temperature acquisition module and the A/D convertor module to start operation, convert the collected data into digital quantity, and transmit the converted digital quantity to the host control chip MCU on the acquisition board, or to terminate the operation of the acquisition board by controlling the on-off state of power supply module via the opto-isolator module.

To achieve concise circuit layout and convenient installation, two 6-pin connection ports CN1 and CN2 are provided on each acquisition board of the present invention. The Connection port CN1 has one pin as power supply line, two pins as grounding line, two pins as CAN bus and one pin as input port for the host control chip MCU on the acquisition board. Correspondingly, the connection port CN2 has one pin as power supply line, two pins as grounding line, two pins as CAN bus and one pin as output port of the host control chip MCU on the acquisition board. Connection port CN1 of one acquisition board is connected with connection port CN2 of another acquisition board via a socket piece, so that the connection boards are connected in turn, and the first acquisition board is connected to the host controller. In this way, the host controller is only directly wired to the first acquisition board, and the control signal for next acquisition board to initiate the data transmission is realized by the host control chip MCU of previous acquisition board, which sends a high-voltage signal.

To improve the linearity and counter interference capability of the signals of the voltage acquisition module and the temperature acquisition module, two groups of filter circuits are respectively used in the modules to remove the electromagnet interference on the voltage and temperature signals from the entire vehicle. Then the filtered voltage signal is partitioned by a precision resistor, and passes through operational amplifier before being input into the A/D convertor module for simulant-to-digital conversion.

All the opto-isolator modules used in the technical solution of the present invention can be substituted with coil isolator modules, which, however, may increase the manufacturing cost of product.

Being simple in structure and convenient in operation, the present invention has the following advantages over the prior art:

1. The voltage and temperature acquisition modules are powered by the battery pack, and the opto-isolator module isolates the high-voltage battery from the low-voltage circuit of host controller, thus avoiding the problem of common mode interference.

2. After converting the collected simulant signals to digital signals via the A/D convertor module, the voltage and temperature acquisition modules use SPI bus to transmit the digital signals to the host control chip MCU via the opto-isolator module. In this way, it is not only feasible to reduce the interference on the accuracy of collected data but also guarantee the speed of signal acquisition.

3. Each acquisition board in the present invention merely collects the signals of one battery pack, and the relative voltage of each battery pack is basically fixed. In this way, the voltage obtained from the acquisition module will not be too high, so that the difficulty in circuit design is reduced, the balance between the batteries is not be affected, and the consistency and interchangeability of acquisition boards are guaranteed.

4. The wiring of the entire system is reduced so that the entire system becomes more concise and easy to use; Since each acquisition board is provided with two 6-pin connection ports CN1 and CN2 for the power lines, signal lines and CAN buses, and the acquisition boards are mutually connected via socket pieces for power supply and communication.

DETAILED DESCRIPTION OF THE PREFERRED EMBODIMENTS

The operating principle of the present invention is described in details with reference to the attached drawings and the specific embodiments.

Figure 1:
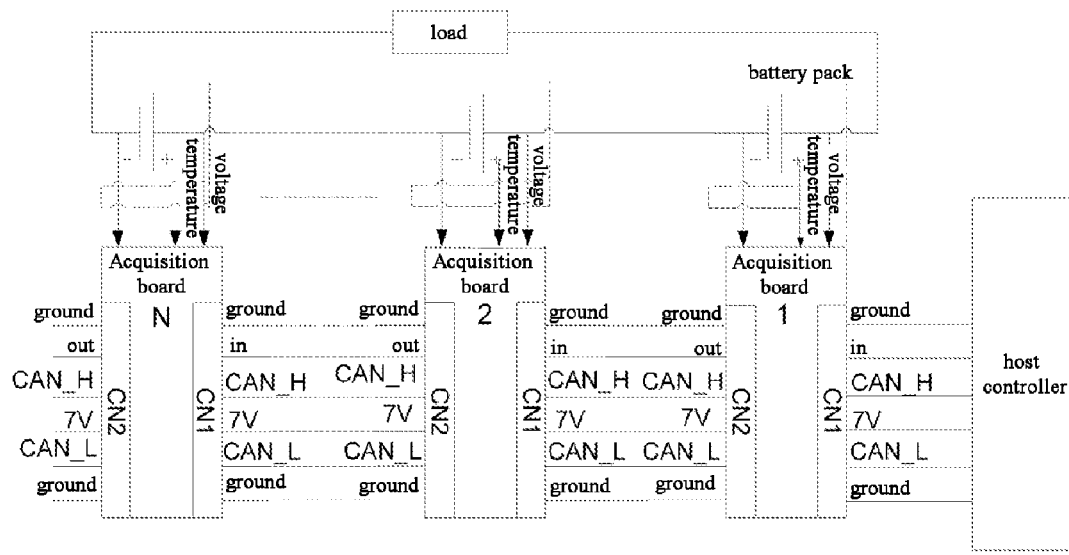
FIG. 1 is a block diagram showing the connection between the acquisition boards and the host controller of the present invention.

FIG. 1 illustrates the connection relations between the acquisition boards and the host controller as well as between the acquisition boards. Each acquisition board has two 6-pin connection ports CN1 and CN2. The signals of the connection port CN1 are the ground, input, CAN_H, 7V, CAN_L and ground in turn; the signals of the connection port CN2 are the ground, output, CAN_H, 7V, CAN_L and ground in turn. Such signals of the connection port CN1 as, the ground, CAN_H, 7V and CAN_L are respectively connected to such signals of the connection port CN2 as, the ground, CAN_H, 7V and CAN_L. The "input" signal of the connection port CN1 is connected to an I/O pin of host control chip MCU; the "output" signal of the connection port CN2 is connected to an I/O pin of the host control chip MCU. Through one "input" pin of the connection port CN1, the host controller inputs a signal to the host control chip MCU, and this signal is used to determine the acquisition board is the first acquisition board. The host control chip MCU of the acquisition board outputs an "output" signal to the connection port CN2, and the "output" signal is transmitted to the "input" pin of the connection port CN1 of the neighboring acquisition board, so that the neighboring collection board is determined as the second acquisition board. In this way, the rest acquisition boards are determined in turn, so that the host controller can recognize to which acquisition board the received acquisition data belongs. In this way, all the acquisition boards are consistent and interchangeable, and cannot be mismatched while being assembled.

Figure 2:
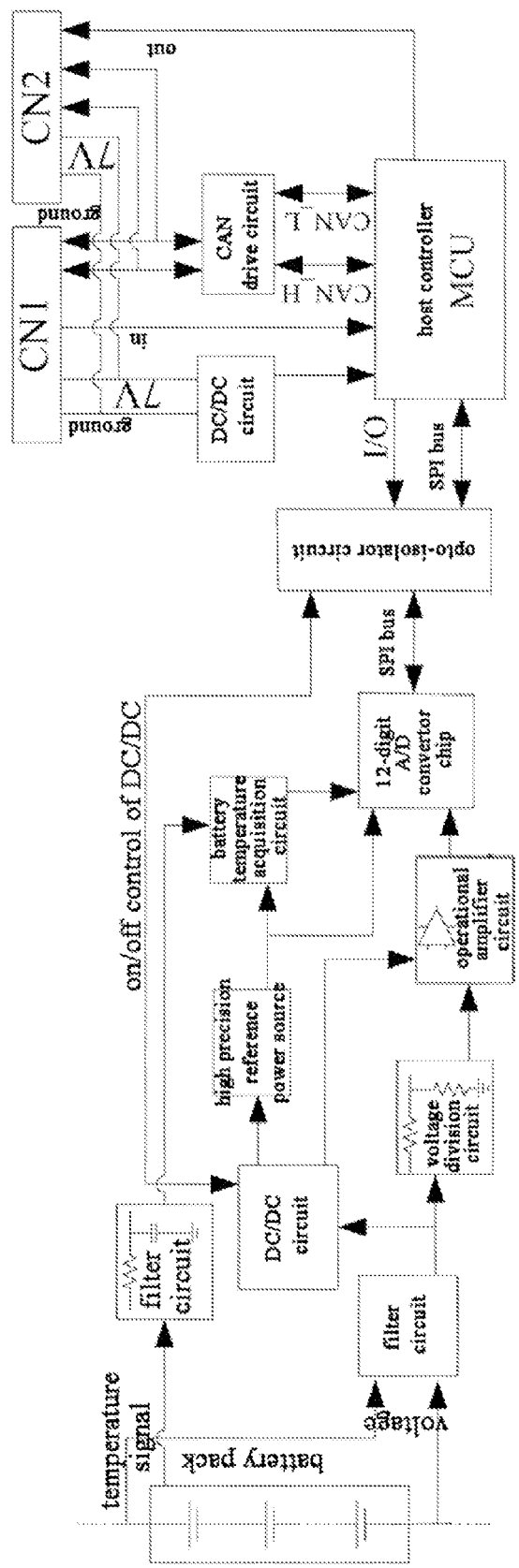
FIG. 2 is the theory diagram for the voltage and temperature of a single battery pack being collected by a acquisition board of the present invention.

FIG. 2 is the theory diagram for the voltage and temperature data of a single battery pack is being collected by an acquisition board of the present invention; the overall configuration of the acquisition board is also shown. The acquisition board mainly carries out the monitoring and detection of the voltage and temperature of each single battery pack (14 single batteries/battery pack) as well as communicates with the host controller. The acquisition board mainly comprises filter circuit, DC/DC circuit, operational amplifier circuit, temperature acquisition circuit, A/D convertor circuit, opto-isolator circuit, host control chip MCU, 7V-to-5V circuit and CAN bus drive circuit, etc. The digital data converted by the A/D convertor circuit is transmitted to the host control chip MCU via a SPI bus after passing through the opto-isolator circuit, and then the host control chip MCU transmits the digital data to the host controller via CAN bus.

Embodiment

Figure 3:
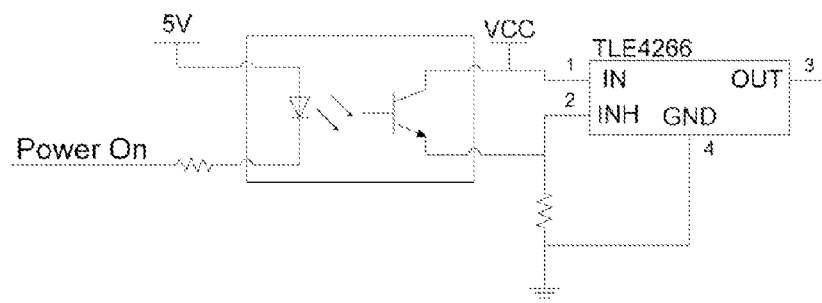
FIG. 3 is the theory diagram for the opto-isolator module controlling the power supply of the acquisition circuit of the present invention.

The present invention is described in details by taking as example the battery packs, having 14 single batteries/battery pack and totaling 126 single batteries in all the packs for a hybrid electric vehicle or electric vehicle. Because the actual operating condition for a vehicle is complex and the electric-magnetic signal interference is serious, a filter circuit is essential. In this embodiment, the filter circuit is composed of coil windings B82790 and a transient state suppression diode. The filtered outputs, undergo DC/DC conversion on the one hand, and voltage division through a precision resistor on the other hand, are input into A/D convertor chip. The DC/DC conversion circuit uses a TLE4266 chip to convert input voltage of the battery to 5V, as shown in FIG. 3. The acquisition circuit can be controlled to power through controlling the INH pin of the TLE4266 chip. When an I/O pin POWER ON of the host control chip MCU outputs a low voltage level, the opto-couple SFH6756 converts the INH pin of TLE4266 chip to a high voltage level, and then the TLE4266 chip operates and exports 5V voltage for the use of the operational amplifier circuit, the high precision reference power supply circuit and the opto-isolator circuit. The high precision reference power supply circuit uses 4.096V0.1% precision voltage exported by MAX6033 chip as a reference voltage for the temperature acquisition circuit and the A/D convertor circuit.

Under the actual operating conditions of the vehicle and the battery properties, the voltage range of each single battery is 0.7V ~1.65V and the voltage range of one single battery pack is:

Lower limit: U=0.7V*14=9.8V
Upper limit: U=1.65V*14=23.1V

Therefore it is thus worked out that the operating voltage of one single battery pack (14 batteries/battery pack) ranges from 9.8V to 23.1V. In this system, the voltage acquisition scheme for a single battery pack (14 batteries/battery pack) is as follows: Firstly, voltage division is performed through a a precision resistor, so that the voltage exported to the operational amplifier LMC7111 ranges from 1.74V to 4V; the operational amplifier LMC7111 is used as a follower so as to improve the counter-interference capability and acquisition precision; after passing through the operational amplifier LMC7111, the signals are exported to the CHO pin of A/D convertor chip MAX144 for A/D conversion.

Since the temperature variation is relatively slow, and the requirement for data acquisition precision is not high, the battery temperature acquisition circuit uses thermal resistor sensor to meet the requirement and save cost. The temperature measurement range is: −50° C.~+120° C.

An A/D convertor chip MAX144 is used in the A/D convertor circuit. The chip has 12-digit acquisition precision, two acquisition channels, with speed of 108 ksps, low power consumption and built-in SPI bus driving. Through the SPI bus, the host control chip MCU controls the A/D convertor chip MAX144 to detect the voltage and temperature of the batteries. The acquired datum converted by the A/D conversion are transmitted to the host control chip MCU through the SPI bus, and they are further transmitted to the host controller via a CAN bus.

The opto-isolator circuit uses high speed opt-couple SFH6756 chip, with speed up to 10 Mbd. The SPI bus has five routes of signal, namely, clock signal (SCLK), chip selection signal (CS), data input (DIN), data output (DOUT) and indicative signal (SSTRB). An additional route of signal for power supply control of the acquisition circuit is also needed, so all together six opto-couple channels are needed. Each SFH6756 chip has two opto-couples; therefore three SFH6756 chips are used in this embodiment.

An 8-bit singlechip comprising SPI bus and CAN bus is used by the host control chip MCU. The host control chip MCU circuit supply the 5V voltage to the singlechip and the CAN drive circuit, which is converted from 7V power supply of the host controller through a voltage regulator chip, and the CAN drive circuit uses a PAC82C250 chip.

Said embodiments merely embody the preferred technical solution of the present invention. Person skilled in the art may make some modifications to some parts of the present invention. So long as they can embody the principle of the present invention, these modifications will still fall within the claims of the present invention.

The invention claimed is:

1. An apparatus for monitoring battery voltage and temperature comprising a host controller and acquisition boards, characterized in the following: the acquisition board for each battery pack includes a voltage acquisition module, a temperature acquisition module, a host control chip MCU, an A/D convertor module, an opto-isolator module, a CAN bus communication module and two external connection ports CN1, CN2; wherein the input end of the A/D convertor module is connected with the output ends of the voltage acquisition module and the temperature acquisition module; the output end of the A/D convertor module is connected with the opto-isolator module via a SPI bus; a I/O port of the SPI bus module in the host control chip MCU is connected with the opto-isolator module; the host control chip MCU is connected with the CAN bus communication module on the host controller via the CAN bus communication module; the acquisition boards are connected with one another in turn with connection port CN1 of one acquisition board being connected with connection port CN2 of the next acquisition board via a socket piece; and the power supply of the host controller powers the host control chip MCU on each acquisition board via the connection ports of the acquisition board; both the connection ports CN1 and CN2 on the acquisition board are 6-pin ports, one pin as power supply line, two pins as grounding line, two pins as CAN bus and one pin as I/O port of the host control chip MCU on the acquisition board.

2. The apparatus for monitoring battery voltage and temperature of claim 1, wherein each acquisition board only collects the voltage and temperature of one single battery pack.

3. The apparatus for monitoring battery voltage and temperature of claim 1, wherein the opto-isolator module on the acquisition boards isolates the voltage acquisition module and the temperature acquisition module from the host control chip MCU.

4. The apparatus for monitoring battery voltage and temperature of claim 1, wherein the single battery pack powers the voltage acquisition module, the temperature acquisition module, the A/D convertor module and the opto-isolator module after its voltage being filtered and regulated through a voltage regulator chips.

5. The apparatus for monitoring battery voltage and temperature of claim 1, wherein after passing through the opto-isolator module, control signals issued by the host control chip MCU on the acquisition board control the voltage acquisition module, the temperature acquisition module and the A/D convertor module to start or terminate operation.

6. The apparatus for monitoring battery voltage and temperature of claim 1, wherein the power supply of the host controller powers the host control chip MCU, the opto-isolator module and the CAN driver module on acquisition board.

7. The apparatus for monitoring battery voltage and temperature of claim 1, wherein the host control chip MCU on the acquisition board controls the next acquisition board connected with its connection port CN2 to transmit data to the host controller.

8. The apparatus for monitoring battery voltage and temperature of claim 1, wherein the I/O port of the host control chip MCU on acquisition board is connected with the opto-isolator module through the SPI bus.

9. The apparatus for monitoring battery voltage and temperature of claim 1, wherein in the voltage acquisition module and the temperature acquisition module, a filter circuit is used to remove the electromagnet interference on the voltage and temperature signals from the entire vehicle; the filtered voltage signals are partitioned by a precision resistor and pass through an operational amplifier before being input into the A/D convertor module for simulant-to-digital conversion.

* * * * *